United States Patent
Khatami et al.

(10) Patent No.: US 7,457,912 B2
(45) Date of Patent: *Nov. 25, 2008

(54) RUNTIME FLASH DEVICE DETECTION AND CONFIGURATION FOR FLASH DATA MANAGEMENT SOFTWARE

(75) Inventors: Joseph Khatami, Tracy, CA (US); Van Nguyen, San Jose, CA (US); Wanmo Wong, Menlo Park, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/895,185

(22) Filed: Aug. 23, 2007

(65) Prior Publication Data

US 2007/0291552 A1    Dec. 20, 2007

Related U.S. Application Data

(63) Continuation of application No. 10/663,279, filed on Sep. 16, 2003, now Pat. No. 7,277,978.

(51) Int. Cl.
G06F 12/00    (2006.01)

(52) U.S. Cl. .................. 711/103; 711/100; 711/170; 365/185; 713/1; 713/2

(58) Field of Classification Search .................. None
See application file for complete search history.

(56) References Cited

U.S. PATENT DOCUMENTS

| | | | |
|---|---|---|---|
| 6,118,694 A | 9/2000 | Bell et al. | |
| 6,223,290 B1 | 4/2001 | Larsen et al. | |
| 6,275,412 B1 | 8/2001 | Kasa et al. | |
| 6,279,069 B1 | 8/2001 | Robinson et al. | |
| 6,442,683 B1 | 8/2002 | Fleming, III | |
| 6,473,854 B1 | 10/2002 | Fleming, III | |
| 6,650,366 B2 | 11/2003 | Parulski et al. | |
| 6,907,496 B2 | 6/2005 | Langford et al. | |

(Continued)

OTHER PUBLICATIONS

"Designing for Upgrade to the 3 Volt Advanced+ Boot Block Flash Memory" by Intel, Pub. Dec. 1988, pp. 12.

(Continued)

*Primary Examiner*—Hyung Sough
*Assistant Examiner*—Kaushikkumar Patel
(74) *Attorney, Agent, or Firm*—Leffert Jay & Polglaze, P.A.

(57) ABSTRACT

A memory device driver is described that can support multiple differing memory devices, in particular, differing Flash memory devices, by being internally re-configurable to match the driving and management requirements of the particular memory device. This allows for a limited number of operating system versions to be produced and maintained for a given system by the manufacturer, reducing the possibility of misconfiguration of the system/device by the inadvertent updating or programming of the wrong operating system version by an end user or service personnel. The resulting driver routine and/or operating system is also typically smaller than operating systems/drivers that compile in or load multiple separate drivers into themselves. In one embodiment of the present invention, the software driver is automatically configures itself by querying the memory device for a device ID and/or manufacturer code or by detecting a specific characteristic of the memory device being driven.

24 Claims, 4 Drawing Sheets

U.S. PATENT DOCUMENTS

| | | | |
|---|---|---|---|
| 6,970,969 | B2 | 11/2005 | Wong et al. |
| 6,985,778 | B2 | 1/2006 | Kim et al. |
| 6,987,927 | B1 | 1/2006 | Battaglia et al. |
| 7,277,978 | B2 * | 10/2007 | Khatami et al. ............ 711/103 |
| 2002/0194400 | A1 | 12/2002 | Porterfield |

OTHER PUBLICATIONS

"8 Mbit/16 Mbit (X8) Multi-Purpose Flash" by Silicon Storage Technology, Inc., Pub. Jun. 2001, pp. 4.

* cited by examiner

RUNTIME FLASH DEVICE DETECTION AND CONFIGURATION FOR FLASH DATA MANAGEMENT SOFTWARE

RELATED APPLICATIONS

This application is a continuation of U.S. patent application Ser. No. 10/663,279 (allowed), filed Sep. 16, 2003 now U.S. Pat. No. 7,277,978 and titled "RUNTIME FLASH DEVICE DETECTION AND CONFIGURATION FOR FLASH DATA MANAGEMENT SOFTWARE," which is commonly assigned and incorporated by reference in its entirety herein.

TECHNICAL FIELD OF THE INVENTION

The present invention relates generally to memory devices and in particular the present invention relates to Flash memory device drivers and Flash Memory data management software.

BACKGROUND OF THE INVENTION

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to ROM (read-only memory), which permits you only to read data. Most RAM is volatile, which means that it requires a steady flow of electricity to maintain its contents. As soon as the power is turned off, whatever data was in RAM is lost.

Computers almost always contain a small amount of ROM that holds instructions for starting up the computer. Unlike RAM, ROM generally cannot be written to by a user. An EEPROM (electrically erasable programmable read-only memory) is a special type non-volatile ROM that can be erased by exposing it to an electrical charge. EEPROM comprise a large number of memory cells having electrically isolated gates (floating gates). Data is stored in the memory cells in the form of charge on the floating gates. Charge is transported to or removed from the floating gates by specialized programming and erase operations, respectively.

Yet another type of non-volatile memory is a Flash memory. A Flash memory is a type of EEPROM that can be erased in blocks instead of one byte at a time. A typical Flash memory comprises a memory array, which includes a large number of memory cells. Each of the memory cells includes a floating gate field-effect transistor capable of holding a charge. The data in a cell is determined by the presence or absence of the charge in the floating gate. The cells are usually grouped into sections called "erase blocks." The memory cells of a Flash memory array are typically arranged into a "NOR" architecture (each cell directly coupled to a bitline) or a "NAND" architecture (cells coupled into "strings" of cells, such that each cell is coupled indirectly to a bitline and requires activating the other cells of the string for access). Each of the cells within an erase block can be electrically programmed in a random basis by charging the floating gate. The charge can be removed from the floating gate by a block erase operation, wherein all floating gate memory cells in the erase block are erased in a single operation.

Both RAM and ROM memory devices have memory cells that are typically arranged in an array of rows and columns. During operation, a row (page) is accessed and then memory cells can be randomly accessed on the page by providing column addresses. This access mode is referred to as page mode access. To read or write to multiple column locations on a page requires the external application of multiple column addresses. To increase access time, a burst mode access has been implemented. The burst mode uses an internal column address counter circuit to generate additional column addresses. The address counter begins at an externally provided address and advances in response to an external clock signal or a column address strobe signal.

Many memory devices, in particular Flash memory devices, are utilized with specialized software handling and/or memory management routines, generally referred to as "drivers." The drivers are executed on the "host," typically a processor or memory controller, and allow the memory device(s) being utilized to be read from and written to by the host. In many systems the drivers also provide a layer of logical abstraction for the host. This is particularly the case with Flash memory devices, presenting the Flash memory device as a freely re-writeable general access memory device or mass storage device, such as a hardrive, a floppy disk, or other non-volatile machine-usable storage device. The drivers, as part of the Flash memory device hardware abstraction, typically also manage the Flash memory devices utilizing internal management routines; scheduling erase blocks to be erased, managing bad erase blocks, protecting and unprotecting erase blocks, and load leveling the Flash memory device.

The driver and/or memory management routines are generally supplied by the memory manufacturer to the end-user or device manufacturer. These driver routines are typically supplied in a source code format or as a linkable library and as such must be compiled into the operating system or overall code executing on the device. Self contained and separately loadable drivers are also possible, but are typically not utilized in embedded processor devices.

The software routines and drivers that operate computer-based devices are often collectively referred to as firmware or ROM after the non-volatile ROM machine-usable storage device that such routines have historically been stored in. It is noted that such firmware or ROM routines are stored on a variety of machine-usable storage mediums or firmware storage mediums that include, but are not limited to, a non-volatile Flash memory, a ROM, an EEPROM, a one time programmable (OTP) device, a complex programmable logic device (CPLD), an application specific integrated circuit (ASIC), a magnetic media disk, etc.

A problem with computer-based or embedded processor systems is the multiple differing memory devices that may be potentially utilized with these devices over their lifetimes of use, or even within a production run of a device. These memory devices may differ from memory manufacturer to memory manufacturer, or from part to part; even if the memory has similar electrical connections or interfaces. As a result, the driver and management software generally differs for each differing type of memory device the manufacturer incorporates into their system. This is particularly the case for Flash memory devices, where a specialized driver is needed to interface with and properly operate the Flash memory. In addition, many Flash memory devices are formatted to resemble mass storage devices, such as magnetic disks, and are not utilized as a general access memory. These specialized Flash memory drivers allows the system to read, erase, program, and manage the erase blocks of a Flash memory device and can be unique to the Flash memory device or manufacturer. In many cases, because the Flash memory device cannot be accessed without use of the Flash memory driver, the driver software is stored on another non-volatile machine-usable medium (such as a Boot ROM or a magnetic disk) and is loaded at system initialization.

As these memory device drivers are typically compiled or loaded into the operating system or application routine (herein operating system) that operates the computer based system, the manufacturers must produce, test, and maintain multiple versions of their operating system software with differing drivers to support all the possible memory devices utilized with the system. This can lead to problems in maintaining these systems or devices, as the end user or service personnel must often update the software of the system when a memory device is updated or replaced, or be aware of the types of memory devices in the system when the system software itself is updated. If they do not correctly match the software to the memory device being utilized the system may be rendered inoperable.

One other way in which this problem of supporting multiple differing memory types has been solved in the past has been by compiling multiple different drivers into the operating system. This allows the operating system to drive any likely memory device of a set likely to be utilized. Unfortunately, the operating system will typically not automatically select the appropriate driver and must be hand configured to use appropriate driver for the memory device being utilized. Additionally, the resulting software, containing multiple separate driver routines, is typically much larger than a single driver executable and thus is not suitable for many embedded devices where resources and non-volatile (boot ROM) storage space is limited. Further, in many of these multiple driver cases the drivers are implemented in a generic and inefficient manner, so as to apply to as many memories types as possible; trading operating efficiency for wider applicability and a smaller code size.

For the reasons stated above, and for other reasons stated below which will become apparent to those skilled in the art upon reading and understanding the present specification, there is a need in the art for alternative methods of detecting and driving different memory devices in computer based systems and, in particular, Flash memory devices.

DETAILED DESCRIPTION

Figure 1:
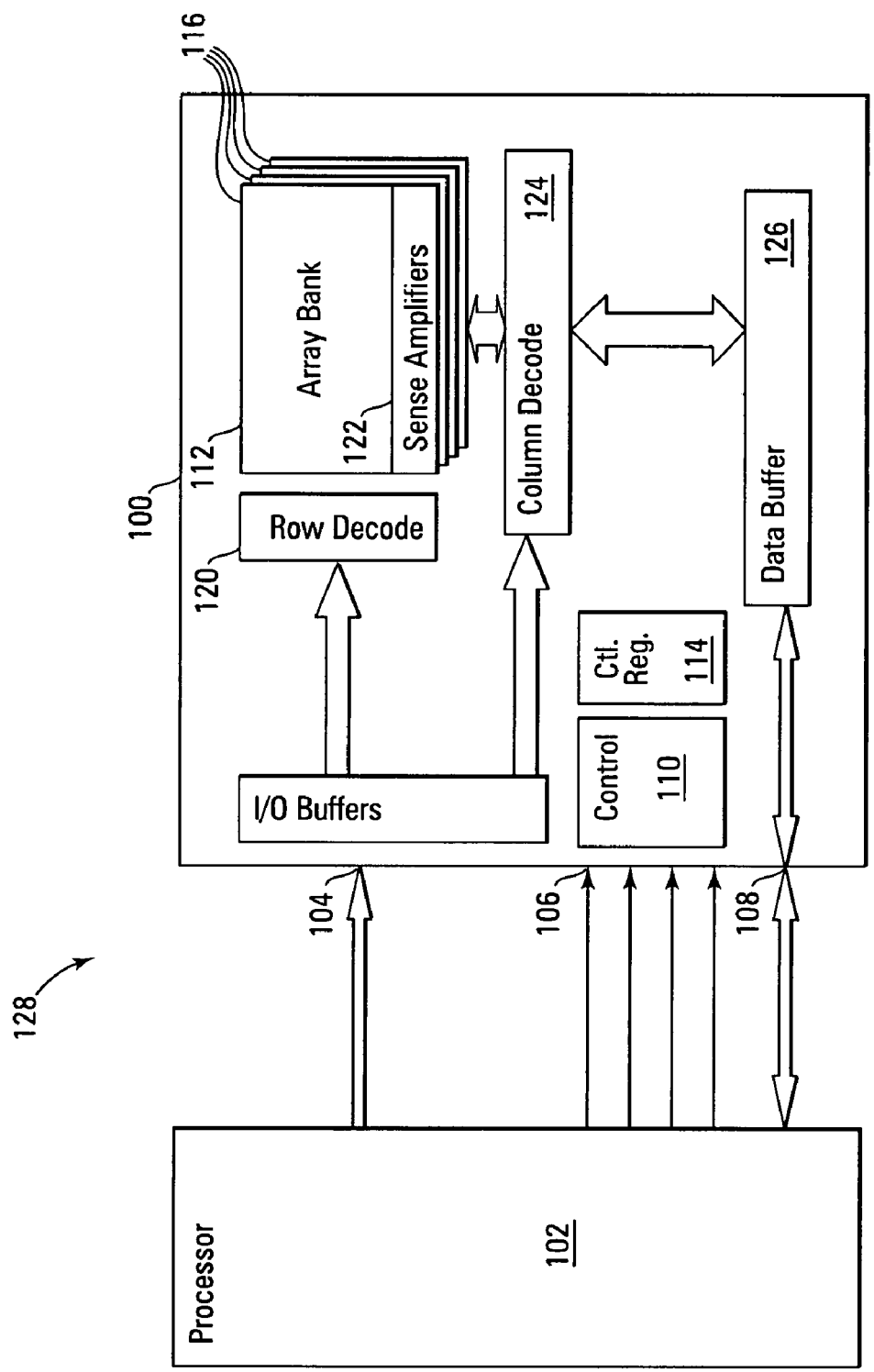
FIG. 1 is a simplified block diagram of a system containing a Flash memory device in accordance with an embodiment of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Embodiments of the present invention include general memory drivers, Flash memory drivers, memory device identification and querying methods that can support multiple differing memory devices, in particular, differing Flash memory devices, by being internally re-configurable to match the driving and management requirements of the particular memory device. This allows for a more limited number of operating system versions/target image, or even just a single version, to be produced and maintained for a given system by the manufacturer. This also reduces the possibility of misconfiguration of the system/device by the inadvertent updating or programming of the wrong operating system version by an end user or service personnel. The resulting driver routine and/or operating system is also typically smaller than operating systems/drivers that compile in multiple separate drivers, and yet as efficient as a driver specifically directed at a single memory device, being internally configured to the memory device. In one embodiment of the present invention, the software driver automatically configures itself by querying the memory device for a device ID and/or manufacturer code or by detecting a specific characteristic of the memory device being driven. In another embodiment, a table contains driver configurations for specific memory device types, data models, and/or memory device usage. In further embodiment, the configuration table is updateable.

As stated above, the two common types of Flash memory array architectures are the "NAND" and "NOR" architectures, so called for the similarity each basic memory cell configuration has to the corresponding logic gate design. In the NOR array architecture, the floating gate memory cells of the memory array are arranged in a matrix similar to RAM or ROM. The gates of each floating gate memory cell of the array matrix are coupled by rows to word select lines (word lines) and their drains are coupled to column bit lines. The source of each floating gate memory cell is typically coupled to a common source line. The NOR architecture floating gate memory array is accessed by a row decoder activating a row of floating gate memory cells by selecting the word line coupled to their gates. The row of selected memory cells then place their stored data values on the column bit lines by flowing a differing current if in a programmed state or not programmed state from the coupled source line to the coupled column bit lines. A column page of bit lines is selected and sensed, and individual data words are selected from the sensed data words from the column page and communicated from the Flash memory.

A NAND array architecture also arranges its array of floating gate memory cells in a matrix such that the gates of each floating gate memory cell of the array are coupled by rows to word lines. However each memory cell is not directly coupled to a source line and a column bit line. Instead, the memory cells of the array are arranged together in strings, typically of 8, 16, or more each, where the memory cells in the string are coupled together in series, source to drain, between a common source line and a column bit line. This allows a NAND Flash array architecture to have a higher memory cell density than a comparable NOR Flash array, but with the cost of a generally slower access rate and programming complexity.

A NAND architecture floating gate memory array is accessed by a row decoder activating a row of floating gate memory cells by selecting the word select line coupled to their gates. In addition, the word lines coupled to the gates of the unselected memory cells of each string are also driven. However, the unselected memory cells of each string are typically driven by a higher gate voltage so as to operate them as pass transistors and allowing them to pass current in a manner that is unrestricted by their stored data values. Current then flows from the source line to the column bit line through each floating gate memory cell of the series coupled string, restricted only by the memory cells of each string that are selected to be read. Thereby placing the current encoded stored data values of the row of selected memory cells on the column bit lines. A column page of bit lines is selected and sensed, and then individual data words are selected from the sensed data words from the column page and communicated from the Flash memory.

Because all the cells in an erase block of a Flash memory device must be erased at once, one cannot directly rewrite a Flash memory cell without first engaging in a block erase operation. Erase block management (EBM)/Flash data management, which can be under the control of an internal state machine of the memory device or part of the driver software/memory management software, provides an abstraction layer for this to the host (typically a processor or an external memory controller), allowing the Flash device to appear as a freely rewriteable device. EBM duties also include, but are not limited to, managing the logical address to physical erase block translation mapping for reads and writes, the assignment of erased and available erase blocks for utilization, and the scheduling erase blocks that have been used and closed out for block erasure. Erase block management also allows for load leveling of the internal floating gate memory cells to help prevent write fatigue failure. Write fatigue is where the floating gate memory cell, after repetitive writes and erasures, no longer properly erases and removes charge from the floating gate. Load leveling procedures increase the mean time between failure of the erase block and Flash memory device as a whole.

Because of the complexity of the tasks of managing and interfacing to the memory device(s), the driver software/memory management software is typically segmented into a data manager layer (that is responsible for the higher level interfacing such as erase block management and address/logical device abstraction and can include a linear data manager and a segment data manager for managing linear blocks or data and data packets respectively) and a low level device driver layer (that is responsible for the interfacing, command set sequences, and timing of interfacing to the specific memory device). These driver software/memory management software layers typically interface between each other by means of a defined "application interface" (API) that allows the differing layers to function without direct knowledge or control of the other layers.

Additionally, there is sometimes a further driver layer between the operating system/application, called the file manager. The file manager is responsible for managing the data entities (typically separate data files or structures) and the format of the memory device. The file manager (or in some cases, the data manager) can tailor its operation of the memory device to the device's storage usage by the operating system/application. The storage usage or access patterns of the memory device are called the "data model" of the memory use and can be used to tailor/optimize the memory's utilization by the application/system it is installed in. For example, a digital camera would require large data file storage that was frequently erased and reprogrammed, whereas a cell phone would typically require storage of many small data entities that would be frequently accessed but seldom changed.

In many modern Flash memory device implementations, the host interface and erase block management routines additionally allow the Flash memory device to appear as a read/write mass storage device (i.e., a magnetic disk) to the host. One such approach is to conform the interface to the Flash memory to be identical to a standard interface for a conventional magnetic hard disk drive allowing the Flash memory device to appear as a block read/write mass storage device or disk. This approach has been codified by the Personal Computer Memory Card International Association (PCMCIA), Compact Flash (CF), and Multimedia Card (MMC) standardization committees, which have each promulgated a standard for supporting Flash memory systems or Flash memory "cards" with a hard disk drive protocol. A Flash memory device or Flash memory card (including one or more Flash memory array chips) whose interface meets these standards can be plugged into a host system having a standard DOS (Disk Operating System) or compatible operating system with a Personal Computer Memory Card International Association-Advanced Technology Attachment (PCMCIA-ATA) or standard ATA interface. Other additional Flash memory based mass storage devices of differing low level formats and interfaces also exist, such as Universal Serial Bus (USB) Flash drives or Sony MemoryStick.

Many of the modern computer operating systems, such as DOS, were developed to support the physical characteristics of hard drive structures; supporting file structures based on heads, cylinders and sectors. The DOS software stores and retrieves data based on these physical attributes. Magnetic hard disk drives operate by storing polarities on magnetic material. This material is able to be rewritten quickly and as often as desired. These characteristics have allowed DOS to develop a file structure that stores files at a given location which is updated by a rewrite of that location as information is changed. Essentially all locations in DOS are viewed as fixed and do not change over the life of the disk drive being used therewith, and are easily updated by rewrites of the smallest supported block of this structure. A sector (of a magnetic disk drive) is the smallest unit of storage that the DOS operating system supports. In particular, a sector has come to mean 512 bytes of information for DOS and most other operating systems in existence. Flash memory systems that emulate the storage characteristics of hard disk drives are preferably structured to support storage in 512 byte blocks along with additional storage for overhead associated with mass storage, such as ECC (error correction code) bits, status flags for the sector or erase block, and/or redundant bits.

FIG. 1 shows a simplified diagram of a system 128 incorporating a Flash memory device 100 of the present invention coupled to a host 102, which is typically a processing device or memory controller. Flash driver routines can be stored in internal non-volatile memory that is incorporated in some hosts (typically embedded processors with internal memory arrays) or in a secondary machine-usable memory device (such as a boot ROM) coupled to the host. The Flash memory device 100 has an address interface 104, a control interface 106, and a data interface 108 that are each coupled to the processing device 102 to allow memory read and write accesses. Internal to the Flash memory device, a control state machine 110 directs the internal operation; managing the Flash memory array 112 and updating RAM control registers and non-volatile erase block management registers 114. The RAM control registers and tables 114 are utilized by the control state machine 110 during operation of the Flash memory device 100. The Flash memory array 112 contains a sequence of memory banks or segments 116. Each bank 116 is organized logically into a series of erase blocks (not shown). Memory access addresses are received on the address interface 104 of the Flash memory device 100 and divided into a row and column address portions. On a read access the row address is latched and decoded by row decode circuit 120, which selects and activates a row page (not shown) of memory cells across a selected memory bank. The bit values encoded in the output of the selected row of memory cells are coupled from a local bitline (not shown) to a global bitline (not shown) and detected by sense amplifiers 122 associated with the memory bank. The column address of the access is latched and decoded by the column decode circuit 124. The output of the column decode circuit 124 selects the desired column data from the internal data bus (not shown) that is coupled to the outputs of the individual read sense amplifiers 122 and couples them to the data buffer 126 for transfer from the memory device 100 through the data interface 108. On a write access the row decode circuit 120 selects the row page and column decode circuit 124 selects write sense amplifiers 122. Data values to be written are coupled from the data buffer 126 via the internal data bus to the write sense amplifiers 122 selected by the column decode circuit 124 and written to the selected floating gate memory cells (not shown) of the memory array 112. The written cells are then reselected by the row and column decode circuits 120, 124 and sense amplifiers 122 so that they can be read to verify that the correct values have been programmed into the selected memory cells.

Figure 2:
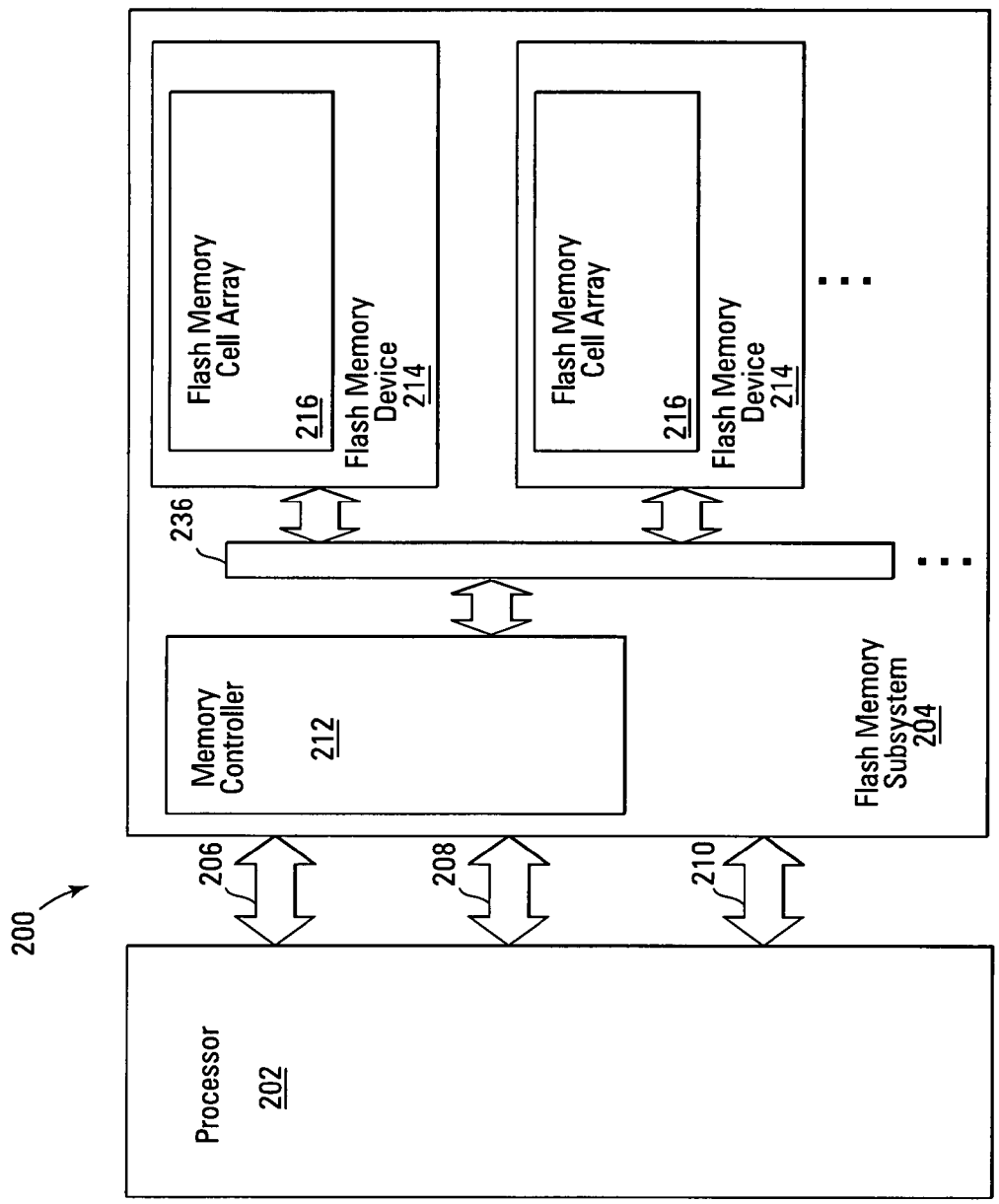
FIG. 2 is a simplified block diagram of a system containing a Flash memory subsystem in accordance with an embodiment of the present invention.

FIG. 2 is a simplified diagram of another system 200 that incorporates a Flash memory subsystem 204 and associated Flash driver software routines of an embodiment of the present invention. In the system 200 of FIG. 2, the Flash memory subsystem 204, such as a memory system or Flash memory card, is coupled to a processor 202 with a synchronous interface having an address 206, control 208, and data bus 210. Internal to the Flash memory system 200, a memory controller 212 directs internal operation of the Flash memory system 200; managing the Flash memory devices 214, directing data accesses, updating internal control registers and tables (not shown), and/or directing operation of other possible subsystems (not shown) of the Flash memory system 200. The memory controller 212 is coupled to and controls one or more Flash memory devices 214 via an internal bus 236. Each Flash memory device 214 contains a sequence of erase blocks (not shown) in an internal memory array 216. It is noted that other architectures of Flash memory systems 200, external interfaces 206, 208, 210, and manners of coupling the memory controller 212 to the Flash memory devices 214, such as directly coupled individual control busses and signal lines, are possible and should be apparent to those skilled in the art with benefit of the present disclosure.

Memory devices are typically coupled to a device select line and/or placed in a specific range of address location(s) in the memory range (also known as a memory map) of the host they are coupled to. With device select lines, to access a specific memory device the host activates the device select line coupled to the memory device and begins addressing its memory locations. With a memory mapped memory device, the address location of the selected memory device is addressed directly to communicate with the memory device. In many cases these two techniques are combined, requiring host memory accesses to activate a device select line and address the access to the base address of the memory device in the host's memory range.

Many modern Flash memories devices include an address that when issued a command (the designated address of the Flash memory is written to with an appropriate data value) the memory device type identification or other vendor information (the response) is then read from the device from the same address location or other designated memory locations. Typically, in these devices other commands can also request device timing and voltage information, device geometry information, or user/vendor defined information.

One such interface is called a "common Flash interface" (CFI) and provides certain simple low level communication with the Flash memory for identifying the Flash memory device. In utilizing a Flash memory that conforms to the CFI standard, a special query is sent to a designated address of the Flash memory and the response is read from the device in other designated memory locations. One CFI command requires the Flash memory device to respond with its memory device type identification or other vendor information. The CFI commands can also request device timing and voltage information, device geometry information, or user/vendor defined information.

Additionally, some Flash memories include special purpose "protection" registers. Protection registers are limited-size non-volatile storage areas that are separate from the erase blocks of the Flash memory. Protection registers are typically utilized for storage of special purpose device identifiers and/ or security codes that are associated with the Flash memory device and/or the data contents of its erase blocks. Once programmed, protection registers can be locked by the programming of "lock bits" that are associated with each individual protection register and/or protection register segment. There usually are 128 bits of protection register storage in a typical Flash memory device. Typically, one half of the Flash memory protection register, a 64 bit "factory" segment, is programmed and locked by the memory chip manufacturer with a device ID that identifies the Flash memory. The remaining half, the original equipment manufacturer or "OEM" segment, can be programmed and locked by the end-user or the manufacturer of a device or system that incorporates the Flash memory device. This user-programmable portion of the Flash memory is typically utilized to implement security schemes, simplify manufacturing, and/or reduce system maintenance.

Figures 3A, 3B:
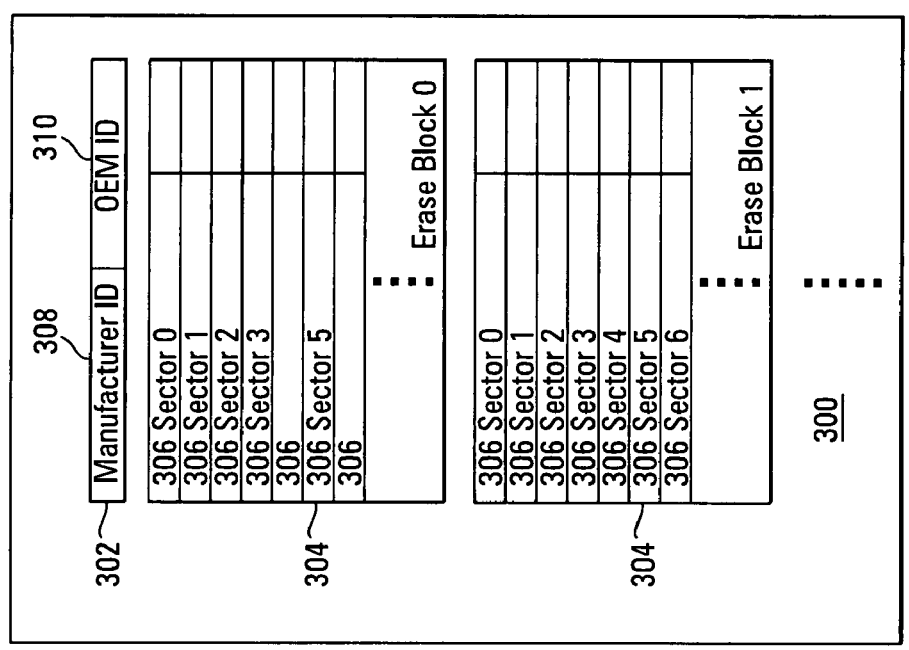
FIGS. 3A and 3B are simplified block diagrams of Flash memory arrays in accordance with an embodiment of the present invention.

FIG. 3A shows a simplified block diagram of a Flash memory array 300 of an embodiment of the present invention. In FIG. 3A, a Flash memory array 300 contains a protection register 302 and a sequence of erase blocks 304. Each erase block 304 contains a series of sectors 306 that are typically each written to a single row of the memory array 300 and include a user data space or area and an associated control or overhead data space or area. The control/overhead data space contains overhead information for operation of the sector it is associated with. Such overhead information typically includes, but is not limited to, erase block management (EBM) data, sector status information, or an error correction code (ECC, not shown). The user data space in each sector 306 is typically one or more multiples of 512 bytes long (depending on memory array 300 row size), wherein one or more logical/operating system (OS) sectors of 512-bytes or multiple logically addressed data words can be stored on the row or sector 306. In a typical Flash memory array 300 each erase block 304 typically contains 64, 128, or more sectors 306. Each new 512 bytes of user data and its associated overhead data are together written into an available erase block sector 306 (i.e., User data A with Overhead data A within a single erase block sector 306) as the user data arrives at the Flash memory array 300. User data is typically written sequentially into the sectors 306 of an erase block 304 until it is filled.

The protection register 302 of the Flash memory array 300 is separate from the erase blocks 304 and is separately addressable. There are 128 bits of protection register storage with one half, a 64-bit "factory" segment 308, programmed and locked by the memory chip manufacturer with a device ID that identifies the Flash memory device the array 300 is incorporated in. The remaining half, the original equipment manufacturer or "OEM" segment 310, is programmed and locked by the end-user or the manufacturer of a device or system that incorporates the Flash memory device with the array 300. Typically this protection array is accessible without the need of a software driver, allowing it to be utilized to identify the Flash memory device during initialization.

FIG. 3B shows a simplified block diagram of another Flash memory array 350 of an embodiment of the present invention. In FIG. 3B, a Flash memory array 350 contains a sequence of data words 354 addressed from 0 to N 352. A device ID 358 that identifies the Flash memory device type is stored at address 0 356.

It is noted that other manners of identifying memory devices by querying interfaces, reserved memory locations, protection registers, and other architecture features are possible and should be apparent to those skilled in the art with benefit of the present disclosure.

Software driver embodiments of the present invention query interfaces, reserved memory locations, protection registers, and other architecture features, to determine the type, size, manufacturer, and other pertinent identifying information of the memory device(s) that are coupled to the system. The driver embodiments then configure themselves to match the discovered memory device(s) by altering the internal operation parameters, device command sequences, and/or memory management routines they utilize. In an alternative embodiment, the type memory device(s) can be discovered by reading a configuration stored separate from the memory devices themselves, such as in a non-volatile storage location of an embedded processor, or in a boot ROM.

In one embodiment of the present invention, the software driver matches the discovered memory device type to an entry in a memory type data table. Each memory type data table contains the file manager, data manager configuration, and/or low level driver configuration to configure the driver software for the detected memory type. The data table may contain information such as memory command sequences, device geometry, timing configuration, load leveling configuration, file formats, device formatting, block erasure sequences, and/or memory manufacturer specific commands.

In another embodiment, the data table contains memory data models for the intended usage of the memory device. In one embodiment, the data model is designated by the intended usage by the operating system/application. In yet another embodiment, the data table entry for the specific data model or usage specific memory device parameter/configuration is specified by end-user or vendor configuration data stored in the memory device itself, such as in an OEM protection register or a vendor specified CFI configuration parameter.

In further embodiment of the present invention, the software driver is updateable without requiring updating of the driver itself, or recompilation, by the updating of the configuration data table(s) to cover new or differing types of memory devices. This allows the driver and/or operating system that incorporates the driver to be updated for new memory devices or fix driver problems without requiring its recompilation, testing, and issuance of new driver/operating system versions. This is particularly the case where the new memory type is similar to, or of the same device family, as an existing supported memory type. In another embodiment, the driver is extensible to a new memory type by small changes to its component sections, for example, the low level driver.

Figure 4:
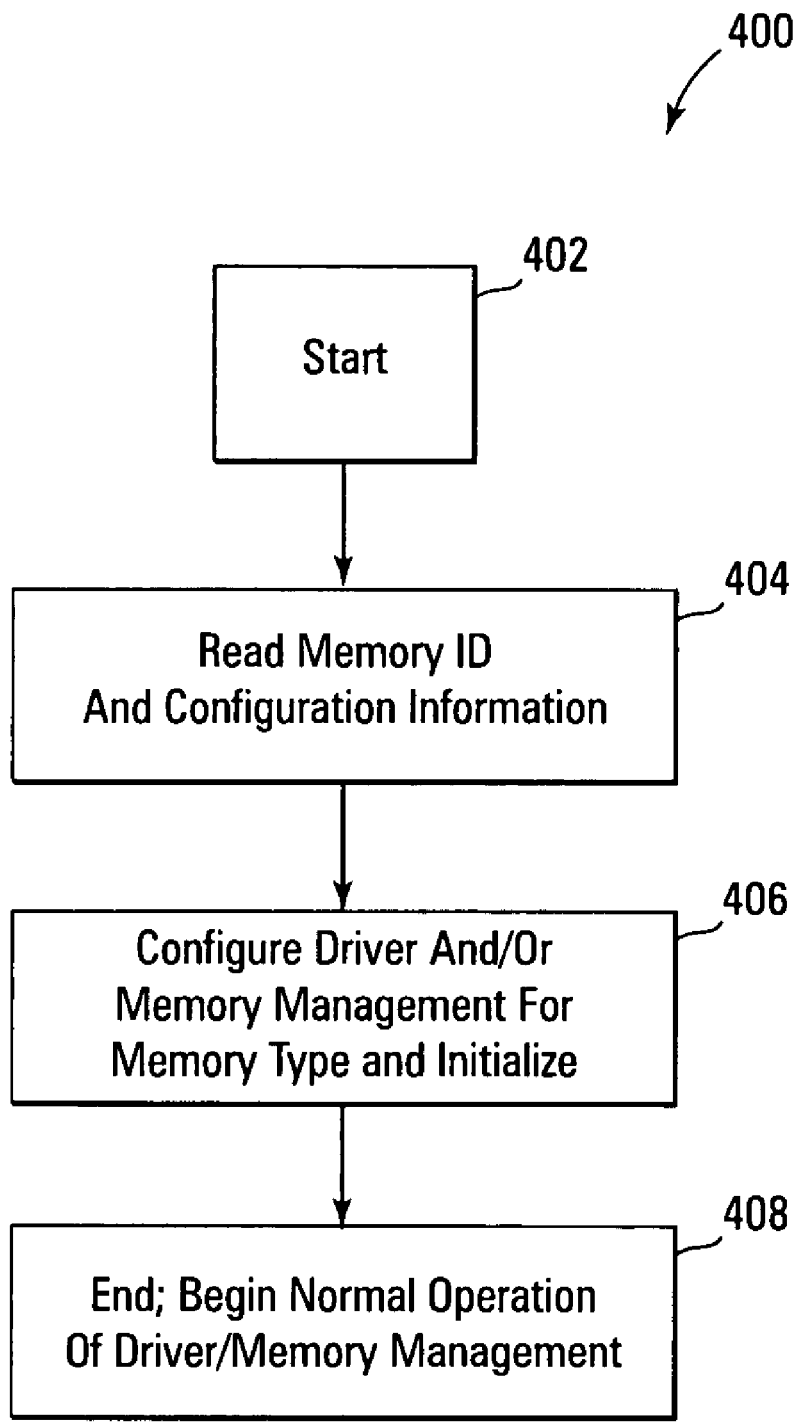
FIG. 4 is a flowchart diagram detailing operation of an embodiment of the present invention.

FIG. 4 shows a simplified flowchart 400 of a method of operating a memory device driver in accordance with an embodiment of the present invention. In FIG. 4, the memory device driver is initialized 402 by being invoked by the operating system during system initialization or power up. The device driver then reads 404 the memory configuration information or queries the memory device ID and configures 406 its internal operation parameters, device command sequences, and/or memory management routines to match the identified memory device(s). The device driver then ends 408 configuration/memory device identification process and begins normal operation of the device driver.

It is noted that systems, methods, and configurable memory device drivers of other embodiments of the present invention are possible and should be apparent to those skilled in the art with the benefit of the present invention.

CONCLUSION

Software memory device driver has been described that can support multiple differing memory devices, in particular, differing Flash memory devices, by being internally re-configurable to match the driving and management requirements of the particular memory device. This allows for a more limited number of operating system versions, or even just a single version, to be produced and maintained for a given system by the manufacturer. This also reduces the possibility of misconfiguration of the system/device by the inadvertent updating or programming of the wrong operating system version by an end user or service personnel. The resulting driver routine and/or operating system is also typically smaller than operating systems/drivers that compile in multiple separate drivers, and yet as efficient as a driver specifically directed at a single memory device, being internally configured to the memory device. In one embodiment of the present invention, the software driver automatically configures itself by querying the memory device for a device ID or manufacturer code or by detecting a specific characteristic of the memory device being driven. In another embodiment, a table contains driver configurations for specific memory device types, data models, and/or memory device usage. In further embodiment, the configuration table is updateable.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of configuring a non-volatile memory device driver comprising:
   detecting a non-volatile memory device type by detecting one or more memory characteristics of a non-volatile memory device;
   selecting a table entry in a table of non-volatile memory device driver configurations by matching the one or more memory characteristics of the detected non-volatile memory device type to the table entry, wherein the table is not stored on the non-volatile memory device and is modifiable to update the table entries, and where the table contains a plurality of table entries, each table entry corresponding to a different memory type; and configuring the non-volatile memory device driver with the memory device driver configuration parameters from the selected table entry.

2. The method of claim 1, wherein detecting one or more memory characteristics of a non-volatile memory device further comprises detecting interfaces, reserved memory locations, protection registers, and architecture features.

3. The method of claim 1, wherein configuring a non-volatile memory device driver with the memory device driver configuration parameters from the selected table entry further comprises configuring a non-volatile memory device driver with one of memory device command sequences, device geometry, device timing specifications, load leveling configuration, file format configuration, device formatting specifications, block erasure sequences, memory management routines, and memory manufacturer specific command sequences.

4. The method of claim 1, wherein each table entry in the table contains one of a file manager configuration, a data manager configuration, and a low level driver configuration.

5. The method of claim 4, wherein the table contains one or more memory data models for utilization of the non-volatile memory device.

6. The method of claim 1, further comprising updating the table for a new non-volatile memory device type.

7. A method of operating a system comprising:
detecting one or more characteristics of at least one non-volatile memory device coupled to a host to discover the memory type;
matching the discovered memory type to a table entry in a table;
loading memory device driver configuration parameters from the table entry that matches the discovered memory type into a memory device driver;
wherein the table is not stored on the at least one non-volatile memory device;
wherein the table contains a plurality of table entries, each table entry corresponding to a different memory type; and
wherein the table is modifiable to update the entries of memory types and parameters.

8. The method of claim 7, wherein detecting one or more characteristics of at least one non-volatile memory device to discover the memory type further comprises writing to an address of the at least one non-volatile memory device and reading a response from the address.

9. The method of claim 7, wherein detecting one or more characteristics of at least one non-volatile memory device to discover the memory type further comprises reading a protection register of the at least one non-volatile memory device.

10. The method of claim 7, wherein detecting one or more characteristics of at least one non-volatile memory device to discover the memory type further comprises detecting one or more architecture features of the at least one non-volatile memory device.

11. The method of claim 7, wherein the table contains at least one of a low level driver configuration, a data manager configuration, and a file manager configuration.

12. The method of claim 7, wherein the table contains two or more entries for a selected memory type, where each of the two or more entries contains a different access data model.

13. The method of claim 12, wherein loading memory device driver configuration parameters from the table entry that matches the discovered memory type into a memory device driver further comprises loading the memory device driver with memory management routines to match one of the discovered memory type and the storage utilization of the at least one non-volatile memory device.

14. A system comprising:
at least one non-volatile memory device; and
a host coupled to the at least one non-volatile memory device, wherein the host is adapted to detect one or more memory characteristics of the at least one non-volatile memory device and configure a non-volatile memory driver routine to access the at least one non-volatile memory device in response to the detected memory type by matching the detected non-volatile memory device to an entry in a table and loading parameters from the table entry to configure the non-volatile memory driver routine;
wherein the table is not stored on the at least one non-volatile memory device and contains a plurality of table entries, each table entry corresponding to a different memory type, and where the table is modifiable to update the entries.

15. The system of claim 14, wherein the host is one of a processor and an external memory controller.

16. The system of claim 14, wherein the host is adapted to detect one of memory interfaces, reserved memory locations, protection registers, and memory architecture features.

17. The system of claim 14, wherein the host is adapted to configure the non-volatile memory device driver routine with one of memory device command sequences, device geometry, device timing specifications, load leveling configuration, file format configuration, device formatting specifications, block erasure sequences, memory management routines, and memory manufacturer specific command sequences.

18. The system of claim 14, wherein the host is adapted to configure the non-volatile memory device driver routine with memory management routines to match one of the detected memory type and the storage utilization of the at least one non-volatile memory device.

19. A machine-usable medium, the machine-usable medium containing a software routine for causing a processor to execute a method, wherein the method comprises:
detecting a non-volatile memory device type by detecting one or more memory characteristics of a non-volatile memory device;
selecting a table entry in a table of non-volatile memory device driver configurations by matching the one or more memory characteristics of the detected non-volatile memory device type to the table entry, wherein the table is not stored on the non-volatile memory device and contains a plurality of table entries, each table entry corresponding to a different memory type, and where the table is modifiable to update the table entries; and
configuring a non-volatile memory device driver with the memory device driver configuration parameters from the selected table entry.

20. A method of configuring a non-volatile memory device driver comprising:
detecting a non-volatile memory device type by detecting one or more memory characteristics of a non-volatile memory device; and
selecting and configuring parameters of a non-volatile memory device driver configuration of one or more non-volatile memory device driver configurations into the non-volatile device driver by matching the one or more memory characteristics of the detected non-volatile memory device type;
selecting and configuring a data model of one or more data models into the non-volatile device driver by matching a desiguated utilization of the non-volatile memory device by an operating system or an application routine;

wherein the one or more data models and one or more non-volatile memory device driver configurations are not stored on the non-volatile memory device.

21. The method of claim 20, wherein the one or more data models and one or more non-volatile memory device driver configurations are modifiable to update the one or more data models and one or more non-volatile memory device driver configurations.

22. The method of claim 20, wherein detecting one or more memory characteristics of a non-volatile memory device further comprises detecting interfaces, reserved memory locations, protection registers, and architecture features.

23. The method of claim 20, wherein configuring parameters of a non-volatile memory device driver configuration into a non-volatile memory device driver further comprises configuring a non-volatile memory device driver with one of memory device command sequences, device geometry, device timing specifications, load leveling configuration, file format configuration, device formatting specifications, block erasure sequences, memory management routines, and memory manufacturer specific command sequences.

24. The method of claim 20, wherein the data model is further selected for configuration into the non-volatile memory device driver by end-user or vendor configuration data stored in the non-volatile memory device.

* * * * *

UNITED STATES PATENT AND TRADEMARK OFFICE
CERTIFICATE OF CORRECTION

PATENT NO. : 7,457,912 B2 Page 1 of 1
APPLICATION NO. : 11/895185
DATED : November 25, 2008
INVENTOR(S) : Khatami et al.

It is certified that error appears in the above-identified patent and that said Letters Patent is hereby corrected as shown below:

In column 13, line 1, in Claim 20, delete "desiguated" and insert -- designated --, therefor.

Signed and Sealed this

Third Day of March, 2009

JOHN DOLL
*Acting Director of the United States Patent and Trademark Office*